Figure 1:
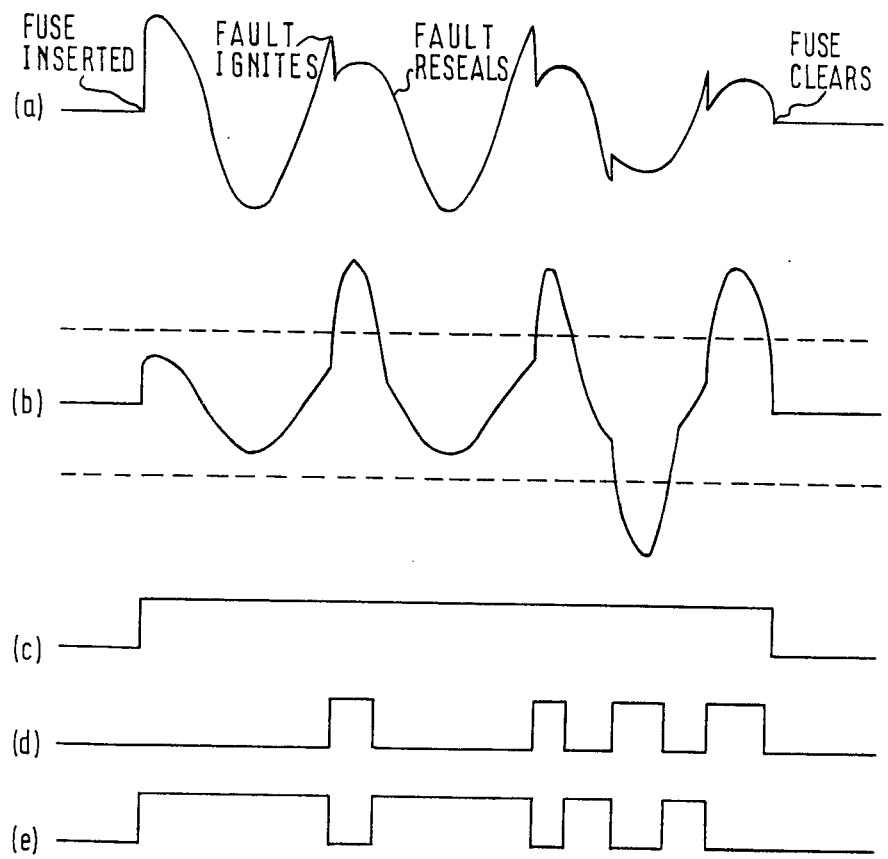

United States Patent [19]

Gale

[11] Patent Number: 4,475,079
[45] Date of Patent: Oct. 2, 1984

[54] APPARATUS FOR LOCATING FAULTS IN ELECTRIC CABLES

[75] Inventor: Philip F. Gale, Ware, England

[73] Assignee: BICC Public Limited Company, London, England

[21] Appl. No.: 496,063

[22] Filed: May 19, 1983

Related U.S. Application Data

[63] Continuation of Ser. No. 43,818, May 30, 1979.

[30] Foreign Application Priority Data

May 31, 1978 [GB] United Kingdom ............... 25903/78

[51] Int. Cl.$^3$ ...................... G01R 31/08; G01R 27/04
[52] U.S. Cl. ..................................... 324/52; 324/58 B
[58] Field of Search .................. 329/52, 58.5 B, 58 B, 329/51

[56] References Cited

U.S. PATENT DOCUMENTS

| | | | |
|---|---|---|---|
| 3,588,611 | 6/1971 | Lambden | 324/58.5 B X |
| 4,151,459 | 4/1979 | Fayolle | 324/52 |

FOREIGN PATENT DOCUMENTS

| | | |
|---|---|---|
| 1591928 | 3/1971 | Fed. Rep. of Germany . |
| 2712570 | 9/1977 | Fed. Rep. of Germany ........ 324/52 |
| 2319135 | 7/1975 | France . |
| 2334116 | 12/1975 | France . |
| 1508351 | 4/1978 | United Kingdom . |
| 1508352 | 4/1978 | United Kingdom . |
| 1515850 | 6/1978 | United Kingdom . |
| 2058507B | 4/1983 | United Kingdom . |

Primary Examiner—Stanley T. Krawczewicz
Assistant Examiner—Jose M. Solis
Attorney, Agent, or Firm—Buell, Blenko, Ziesenheim & Beck

[57] ABSTRACT

Apparatus for detecting and locating a fault in an electric cable using a pulse-echo technique comprises means for injecting step function or single pulses into a cable, means for digitizing and storing the pulse-echo signal obtained under two different conditions of the cable, and means for retrieving the signals obtained under the two said conditions, comparing them and thus locating the position of the fault. Preferably, the apparatus also includes means for detecting whether the cable is "live and healthy" or "live and faulty" by obtaining a digital pulse signal indicating that a voltage is present on the cable, obtaining a second digital pulse signal indicating by a series of pulses when the current in the cable is above the normal load current and gating these two signals in a NAND gate to obtain a signal representing the state of the cable.

8 Claims, 9 Drawing Figures

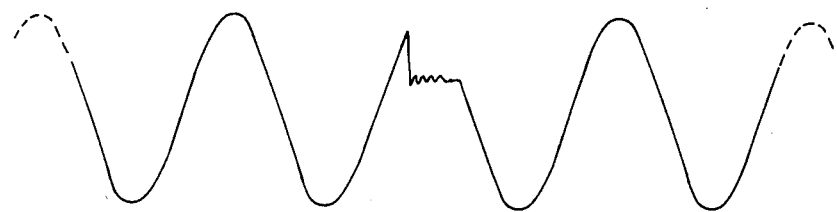
Fig. 2.
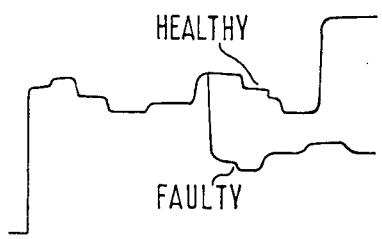
Fig. 3.a.
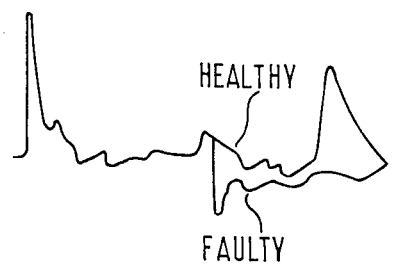
Fig. 3.b.

APPARATUS FOR LOCATING FAULTS IN ELECTRIC CABLES

This application is a continuation of my copending application, Ser. No. 43,818, filed May 30, 1979.

This invention relates to pulse echo fault detectors for electric cable and is applicable more especially, but not exclusively, to fault detection apparatus for use in power distribution cable installations having a number of single or three-phase branches, especially those with difficult or impossible access to a termination or terminations.

Applicant here is a co-inventor and one of the applicants in co-pending application Ser. No. 365,044, filed Apr. 2, 1982, in the names of Philip Franklin Gale and Edward Joseph Bellis, which application is assigned to the same assignee as the present application.

An object is to provide apparatus that can be used with the consumer's apparatus still connected, since its use does not entail hazardous high voltages. A further object is to provide apparatus that will detect low voltage cable faults exhibiting a non-linear and unstable voltage: current characteristic where the fault current only flows during the times when the instantaneous voltage of the supply is greater than the arc voltage of the fault.

The apparatus in accordance with the invention comprises means for injecting step function or single pulses into a cable or cable installation, means for digitising and storing the pulse/echo signal obtained under two different conditions of the cable, and means for retrieving the signals obtained under the two said conditions, comparing them and thus locating the position of the fault.

Examples of two different conditions of the cable from which a pulse/echo signal can be obtained and digitised and stored include (a) before the fault appears and after the fault appears and (b) before the fault is conditioned and after the fault is conditioned.

The use of a step function input is preferred because, with the limited bandwidth of digital recording systems, it has been found that the use of step functions allows greater accuracy of measurement for faults at very short range. The step function also ensures that sufficient energy is injected into the cable to enable long range echoes to be seen, and furthermore tends to reduce many of the minor reflections from short branches. If the recording zero level is suppressed, greater vertical sensitivity can be employed so that smaller differences in the traces can be seen.

The apparatus in accordance with the invention preferably also includes means for detecting whether the cable is "live and healthy" or "live and faulty" by obtaining a digital pulse signal indicating that a voltage is present on the cable, obtaining a second digital pulse signal indicating by a series of pulses when the current in the cable is above the normal load current and gating these two signals in a NAND gate to obtain a signal representing the state of the cable.

Signals obtained under normal and fault conditions are stored and, by retrieving and comparing them, the location of the fault is determined.

Figure 4:
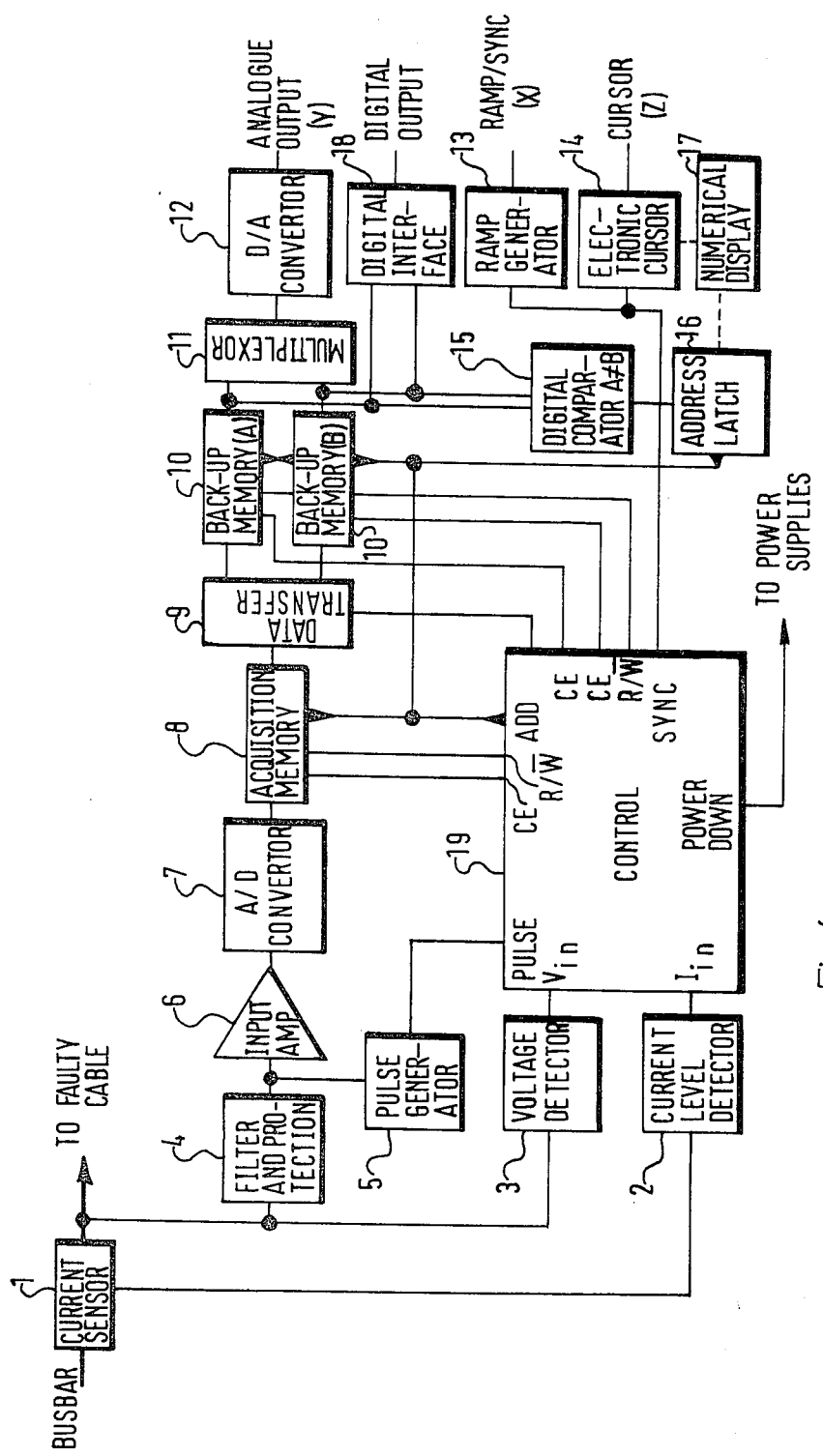

The invention is further illustrated by a description, by way of example, with reference to the accompanying drawings, in which:

FIGS. 1(a) and 1(b), respectively, are the voltage and fault current waveforms of a "permanent" fault on a low voltage cable, that is a fault where a fuse or circuit breaker operates within a short time of the cable being re-energised;

FIGS. 1(c), 1(d) and 1(e) are digital waveforms derived from the voltage and fault current waveforms shown in FIGS. 1(a) and 1(b);

FIG. 2 is the voltage waveform of a typical "transitory fault" on a low voltage cable, that is a fault where intermittent breakdowns occur without the circuit protection operating;

FIGS. 3(a) and 3(b) illustrate pulse-echo recordings obtained during periods when the cable is "live and healthy" and "live and faulty;" and FIG. 4 is a schematic diagram of the preferred pulse echo fault detection apparatus shown connected in the normal supply busbar of a faulty low voltage cable.

Many low voltage cable faults exhibit a non-linear arcing characteristic which produces at the feeding substation, voltage waveforms similar to the voltage waveform shown in FIG. 1(a), which waveform is typical of a category of fault known as a "permanent" fault. The voltage waveform shown in FIG. 1(a) shows two common phenomena associated with low voltage cable faults: first, the fault does not develop immediately the cable is re-energised and, second, the fault current whose waveform is shown in FIG. 1(b), is extremely non-sinusoidal due to the arcing characteristic of the fault.

In addition to "permanent" faults, there are a significant number of faults where a considerable length of time may elapse between re-energising the cable and the fuse operating. This second category of fault is referred to as a "non-persistent" fault.

There is also a third category of fault, known as a "transitory" fault, where intermittent breakdowns occur without the circuit protection operating; a typical transitory fault voltage waveform is shown in FIG. 2. It is known that transitory faults often precede the appearance of both permanent and non-persistent faults and the method of detecting and locating transitory faults provided by the apparatus of the present invention is of considerable value.

The digital waveforms shown in FIGS. 1(c), 1(d), and 1(e) are derived from the voltage and current waveforms shown in FIGS. 1(a) and 1(b) respectively. The waveform shown in FIG. 1(c) is a digital signal which indicates that voltage is present on the cable; the waveform shown in FIG. 1(d) is a digital signal which indicates that the fault current is above a threshold level higher than the normal load current; the waveform shown in FIG. 1(e) is obtained by gating the signals shown in FIGS. 1(c) and 1(d). The waveform shown in FIG. 1(e) indicates when the cable is "live and healthy," whilst the waveform shown in FIG. 1(d) indicates when the cable is "live and faulty".

Comparison of pulse-echo recordings obtained during the periods when the cable is "live and healthy" and when it is "live and faulty" allows the fault point to be identified easily as shown in the typical pulse-echo recordings shown in FIGS. 3(a) and 3(b). In each of FIGS. 3(a) and 3(b) the two pulse-echo recordings are superimposed on one another for ease of comparison, with FIG. 3(a) illustrating the step function response of the cable and FIG. 3(b) illustrating the more common impulse function response.

Referring to FIG. 4, the preferred pulse-echo fault detection apparatus is shown connected in the normal supply busbar of a faulty low voltage cable. The apparatus normally operates from a battery (not shown) which is trickle charged from the supply to the cable under test. When the voltage on the cable under test disappears the control unit of the apparatus automatically isolates the supply to all parts of the circuit of the apparatus which are not essential for the retention of the stored data. Alternatively, the apparatus can be operated from a mains supply which is not on the same phase, or circuit, as the cable under test.

The apparatus includes a current sensor 1, which is either a current transformer or a shunt and which provides a signal to a current level detector 2 which produces an output when the signal level from the current sensor exceeds a pre-set level. The output signal $I_{in}$ of the current level detector 2 (cf FIG. 1(d)) is fed to the control unit 19. A voltage detector 3 produces an output when there is voltage on the cable. The output signal $V_{in}$ of the voltage detector 3 (cf FIG. 1(c)) is also fed to the control unit 19.

A filter and protection circuit 4 isolates and protects the low voltage pulse-echo recording system from the effects of power frequency and other high voltages.

Single impulses (or step functions) are generated by a pulse generator 5 when commanded by the control unit 19. An input amplifier 6 incorporates facilities for varying the sensitivity of the recording system and for level shifting the signal to suppress the zero when step functions are used.

The input analogue signal is sampled and converted into digital code by an analogue to digital convertor 7. To obtain an acceptable compromise between the amplitude and temporal resolution of the recording system the analogue to digital convertor 7 is typically six bits (64 Levels), with a conversion rate of at least 20 MHz. It is necessary to use real-time recording, rather than a sampling technique, as the fault may only exist for a few milliseconds and may also change its character from one breakdown to the next.

The digitised signal from the analogue to digital convertor 7 is stored by an acquistion memory 8 which is typically a high speed "random access memory" of 256 words length which at 20 MHz sampling gives a recording time of 12.8 μs, i.e. a range of approximately 1000 meters of cable. Under command from the control circuit 19, data in the acquisition memory 8 is transferred by a data transfer unit 9 to one of two back-up memories 10A and 10B. These back-up memories provide long term storage of recorded waveforms and are low speed random access memories of 256 words, with low power dissipation so that the data can be preserved for long periods of time using a battery power supply. Alternatively, each of the back-up memories may be a non-volatile memory, for example a magnetic bubble memory or a charge storage memory. A multiplexor 11 allows the data in the back-up memories 10A and 10B to be fed to a common digital to analogue convertor 12 which provides analogue outputs of the stored data in the back-up memories 10A and 10B, which outputs are fed to the Y axis of the display.

A ramp generator 13 gives an X ramp signal, synchronised with the analogue output, to provide a horizontal sweep for the display of a cathode ray oscilloscope. Alternatively, the ramp generator 13 may just provide a synchronising signal to trigger the time-base of an external oscilloscope. An electronic cursor 14 provides a manually controlled signal, synchronised with the analogue output, which allows a marker to be displayed on the display of the cathode ray oscilloscope. This marker is applied to the Z axis of the display.

A digital comparator 15 gives an output when the difference between the data in the back-up memories 10A and 10B exceeds some preset level, and an address latch 16 is used to store the memory location (address) at which, either the digital comparator 15 gives an output signal, or the electronic cursor 14 is set. The address stored in the address latch 16 is converted into a time measurement (referenced to the time at which the pulse generator 5 was triggered) to give a direct readout of the transit time to the fault point on a numerical display 17. This numerical display is preferably used to convert the time measurement into a direct distance measurement by programming the velocity of propagation into it.

A digital output interface 18 is used to allow the data stored in the back-up memories 10A and 10B to be transmitted to a remote location for display or processing.

The control unit 19 comprises a master clock generator (not shown) and provides the address, enable and read/write signals for the memories, and, in addition, controls the power supplies to minimise the power drain once the data is held in the back-up memories 10A and 10B. The control unit 19 enables the acquisition memory 8 before the pulse generator 5 is triggered and also checks that the voltage and current signals do not change during the recording period. Once a recording is complete, the control unit 19 transfers the data from the acquisition memory 8 into one of the back-up memories 10A and 10B and then either resets in preparation for making a second recording under different voltage and current conditions, or, if both back-up memories contain data, it initiates the digital comparison process. If the digital comparator 15 does not detect a significant difference in the data in the two back-up memories 10A and 10B, the control unit resets and the whole recording process begins again.

In the schematic diagram shown in FIG. 4, the XYZ outputs of the display of the cathode ray oscilloscope are shown but the cathode ray oscilloscope itself is not shown. The outputs of the numerical display 17 and of the digital interface 18 are also shown.

If hard copy recordings are required, the analogue outputs can alternatively or additionally be used to drive a plotter.

In using the apparatus shown in FIG. 4 to detect a fault in a low voltage cable, the control unit 19 is normally set to make recordings automatically for the two conditions of "cable live and healthy" and "cable live and faulty." The advantage of comparing the "healthy" and "faulty" traces obtained when the low voltage cable is energised is that both recordings are affected to the same extent by the other cables and equipment connected in parallel with the cable under test. Another advantage of the apparatus of the present invention is that it is also possible to control the recordings manually, so that the same equipment can be used to store conventional "before" and "after" traces.

What I claim as my invention is:

1. Apparatus for detecting and locating, using a pulse-echo technique, unstable and transitory faults as well as stable faults in an energised power distribution electric cable installation which apparatus comprises:
   (a) means for detecting two different conditions from the voltampere characteristics of the electric cable, one of said two different conditions being before a fault appears in one of the power distribution cables of the installation and the other of said two different conditions being whilst a fault is present in one of the power distribution cables of the installation;

(b) means for injecting a single wave shape per measurement cycle having at least a single fast rise front into the energised power distribution cable installation under both different conditions of the installation to obtain pulse-echo signals;

(c) an analogue to digital convertor for digitising the pulse-echo signals obtained under said two different conditions of the installation;

(d) memory means for storing the digitised signals; and (e) means for comparing the waveforms of signals obtained under the two said conditions in order that the distance of the fault in said power distribution cable of the installation can be determined.

2. Apparatus as claimed in claim 1, wherein the apparatus also includes means for detecting whether said power distribution cable of the installation is "live and healthy" or "live and faulty" by obtaining a digital pulse signal indicating that a voltage is present on said cable, means for obtaining a second digital pulse signal indicating by a series of pulses when the current in said cable is above the normal load current and gating means for gating these two signals in a NAND gate to obtain a signal representing the state of said cable.

3. Apparatus as claimed in claim 1 or 2, wherein the apparatus also includes memory means for a long term storage of recorded waveforms so that data can be preserved for long periods of time.

4. Apparatus as claimed in claim 1 or 2, wherein the apparatus also includes a digital to analogue converter for reconstituting the digitised signals to analogue form and wherein the comparing means is a display device on which the waveforms of the reconstructed signals can be compared.

5. Apparatus as claimed in claim 1 or 2, wherein the apparatus also includes a battery which will operate the apparatus and which can be trickle charged from the supply to the installation under test.

6. Apparatus as claimed in claim 1 or 2, wherein the apparatus can be operated from a mains supply which is not on the same phase or circuit as the installation under test.

7. A method of detecting and locating, using a pulse-echo technique, unstable and transitory faults as well as stable faults in an energised power distribution electric cable installation which method comprises:

(a) detecting two different conditions from the volt-ampere characteristics of the electric cable, one of said two different conditions being before a fault appears in one of the power distribution cables of the installation and the other of said two different conditions being whilst a fault is present in one of the power distribution cables of the installation;

(b) injecting a single wave shape per measurement cycle having at least a single fast rise front into the energised power distribution cable installation under two different conditions of the installation to obtain pulse-echo signals;

(c) digitising the pulse-echo singals obtained under said two different conditions of the cable;

(d) storing the digitised signals in a memory means; and (e) comparing the waveforms of signals obtained under the two said conditions and determining the distance of the fault therefrom.

8. A method as claimed in claim 7, wherein determination of whether said power distribution cable of the installation is "live and healthy" or "live and faulty" is effected by obtaining a digital pulse signal indicating that a voltage is present on the cable, obtaining a second digital pulse signal indicating by a series of pulses when the current in the cable is above the normal loading current, and gating these two signals in a NAND gate to obtain a signal representing the state of said cable.

* * * * *